United States Patent
Furuichi et al.

(10) Patent No.: US 9,272,413 B2
(45) Date of Patent: Mar. 1, 2016

(54) CONVEYING SYSTEM

(71) Applicant: KABUSHIKI KAISHA YASKAWA DENKI, Kitakyushu (JP)

(72) Inventors: Masatoshi Furuichi, Kitakyushu (JP); Yoshiki Kimura, Kitakyushu (JP); Tomohiro Matsuo, Kitakyushu (JP); Yoshihiro Kusama, Kitakyushu (JP)

(73) Assignee: KABUSHIKI KAISHA YASKAWA DENKI, Kitakyushu-Shi (JP)

( * ) Notice: Subject to any disclaimer, the term of this patent is extended or adjusted under 35 U.S.C. 154(b) by 471 days.

(21) Appl. No.: 13/688,219

(22) Filed: Nov. 29, 2012

(65) Prior Publication Data
US 2013/0195584 A1    Aug. 1, 2013

(30) Foreign Application Priority Data

Jan. 31, 2012 (JP) ................ 2012-018704

(51) Int. Cl.
*B25J 9/16*    (2006.01)
*B25J 9/04*    (2006.01)
*H01L 21/677*  (2006.01)

(52) U.S. Cl.
CPC ............... *B25J 9/042* (2013.01); *B25J 9/1664* (2013.01); *H01L 21/677* (2013.01); *H01L 21/67766* (2013.01); *Y10S 901/02* (2013.01); *Y10S 901/15* (2013.01)

(58) Field of Classification Search
CPC .......... B25J 9/041; B25J 9/042; B25J 9/1658; B25J 9/1661; B25J 9/1664; G05B 19/4086; G05B 2219/33263; G05B 2219/34134; G05B 2219/35393; G05B 2219/6503; G05B 2219/36504; G05B 2219/45083; G05D 1/0274; H01L 21/67739; H01L 21/67745; H01L 21/67748; H01L 21/67778

USPC .......... 414/217, 222.01, 744.2, 744.4, 744.5, 414/935; 700/245, 250, 251
See application file for complete search history.

(56) References Cited

U.S. PATENT DOCUMENTS 5,281,901 A * 1/1994 Yardley et al. ................ 318/587
6,037,733 A * 3/2000 Genov et al. ............. 318/568.11
(Continued)

FOREIGN PATENT DOCUMENTS

JP    62-282303    12/1987
JP    09-302709    11/1997
(Continued)

OTHER PUBLICATIONS

Japanese Office Action for corresponding JP Application No. 2012-018704, Dec. 10, 2013.
(Continued)

*Primary Examiner* — Ernesto Suarez
*Assistant Examiner* — Brendan Tighe
(74) *Attorney, Agent, or Firm* — Mori & Ward, LLP

(57) ABSTRACT

A conveying system according to an embodiment includes a robot and a controller. The controller includes a switching unit. The robot includes an arm unit formed of a hand and a plurality of arms connected rotatably with respect to one another, and a base unit. An arm on a rear end side is connected to the base unit rotatably about a rotation axis, and the hand is rotatably connected to an arm on a front end side. The switching unit switches cylindrical coordinate control for controlling the arm unit such that a trajectory of the hand overlaps with any one of lines radiating from the rotation axis and rectangular coordinate control for controlling the arm unit such that the trajectory of the hand overlaps with none of the lines at a predetermined timing.

22 Claims, 12 Drawing Sheets

(56) References Cited

U.S. PATENT DOCUMENTS

| | | | |
|---|---|---|---|
| 6,764,271 B2 | 7/2004 | Momoki | |
| 7,874,782 B2 * | 1/2011 | Hashimoto | 414/217 |
| 8,473,096 B2 | 6/2013 | Matsuo et al. | |
| 2005/0067995 A1 * | 3/2005 | Weinhofer et al. | 318/574 |
| 2005/0071021 A1 * | 3/2005 | Weinhofer | 700/63 |
| 2008/0025824 A1 | 1/2008 | Hashimoto | |
| 2008/0304942 A1 * | 12/2008 | Yazawa et al. | 414/217 |
| 2009/0037021 A1 * | 2/2009 | Sladek et al. | 700/245 |
| 2010/0135752 A1 * | 6/2010 | Imai | 414/217 |

FOREIGN PATENT DOCUMENTS

| | | |
|---|---|---|
| JP | 2001-198866 | 7/2001 |
| JP | 2005-019960 | 1/2005 |
| JP | 2008-028134 | 2/2008 |
| KR | 2002-0009656 | 2/2002 |
| KR | 10-2010-0092893 | 8/2010 |

OTHER PUBLICATIONS

Chinese Office Action for corrospondblg CN Application No. 201210574403.8, Apr. 1, 2015.

Korean Office Action for corresponding KR Application No. 10-2012-0152873, Dec. 10, 2013.

Chinese Office Action for corresponding CN Application No. 201210574403.8, Nov. 30, 2015.

* cited by examiner

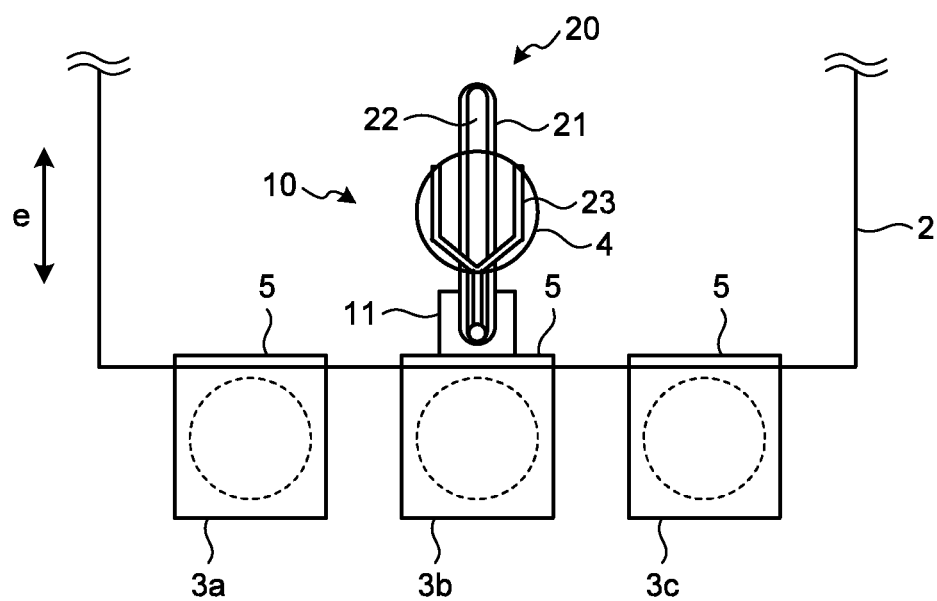

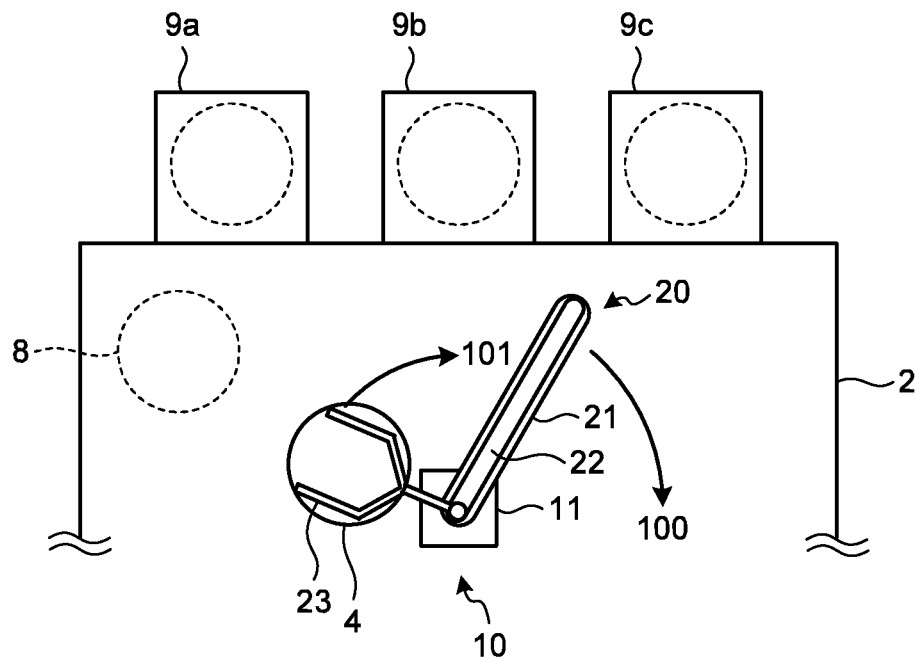
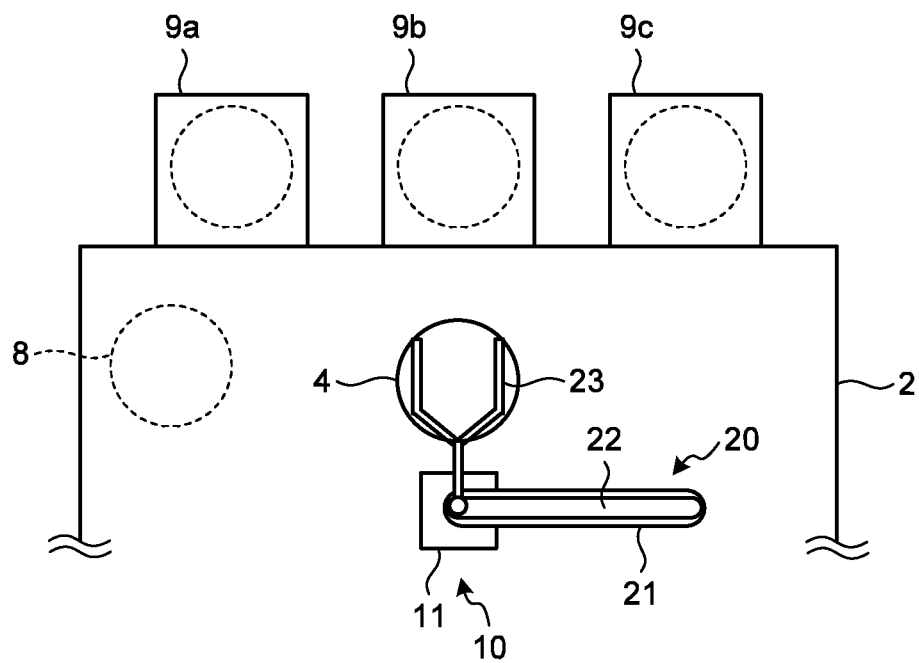

CONVEYING SYSTEM

CROSS-REFERENCE TO RELATED APPLICATION

This application is based upon and claims the benefit of priority of the prior Japanese Patent Application No. 2012-018704, filed on Jan. 31, 2012, the entire contents of which are incorporated herein by reference.

FIELD

The embodiment discussed herein is directed to a conveying system.

BACKGROUND

Conventionally widely known are conveying robots that convey a laminated workpiece (hereinafter, referred to as a "wafer"), such as a semiconductor wafer and a liquid crystal panel. Also known are conveying systems provided with such a conveying robot in a local clean room (hereinafter, referred to as a "conveyance room") arranged between a container of a wafer and a processing room for the wafer.

An area such as the container and the processing room described above (hereinafter, referred to as a "transfer position") is typically provided at such a position that a rotation axis of a conveying robot is not located on an extension of a trajectory of a hand that accesses the transfer position, that is, at an offset position (refer to Japanese Patent Application Laid-open No. 2008-28134, for example).

The conventional conveying system has room for further improvement to increase throughput in conveying processing of a wafer. Specifically, if all the transfer positions are provided at offset positions as described above, a change in the posture of an arm of the conveying robot tends to be made large, resulting in reduction in throughput in the conveying processing.

SUMMARY

A conveying system according to an embodiment includes a robot and a controller. The controller includes a switching unit. The robot includes an arm unit formed of a hand and a plurality of arms connected rotatably with respect to one another, and a base unit. An arm on a rear end side is connected to the base unit rotatably about a rotation axis, and the hand is rotatably connected to an arm on a front end side. The switching unit switches cylindrical coordinate control for controlling the arm unit such that a trajectory of the hand overlaps with any one of lines radiating from the rotation axis and rectangular coordinate control for controlling the arm unit such that the trajectory of the hand overlaps with none of the lines at a predetermined timing.

BRIEF DESCRIPTION OF DRAWINGS

A more complete appreciation of the invention and many of the attendant advantages thereof will be readily obtained as the same becomes better understood by reference to the following detailed description when considered in connection with the accompanying drawings, wherein:

FIG. 3 is a view for explaining a reference posture of the conveying robot.

FIG. 6A is a fifth view for explaining the trajectory of the conveying robot.

FIG. 6B is a sixth view for explaining the trajectory of the conveying robot.

DESCRIPTION OF EMBODIMENT

An exemplary embodiment of a conveying system disclosed in the present application are described below in greater detail with reference to the accompanying drawings. It is to be noted that the embodiment below are not intended to limit the present invention.

Figure 1:
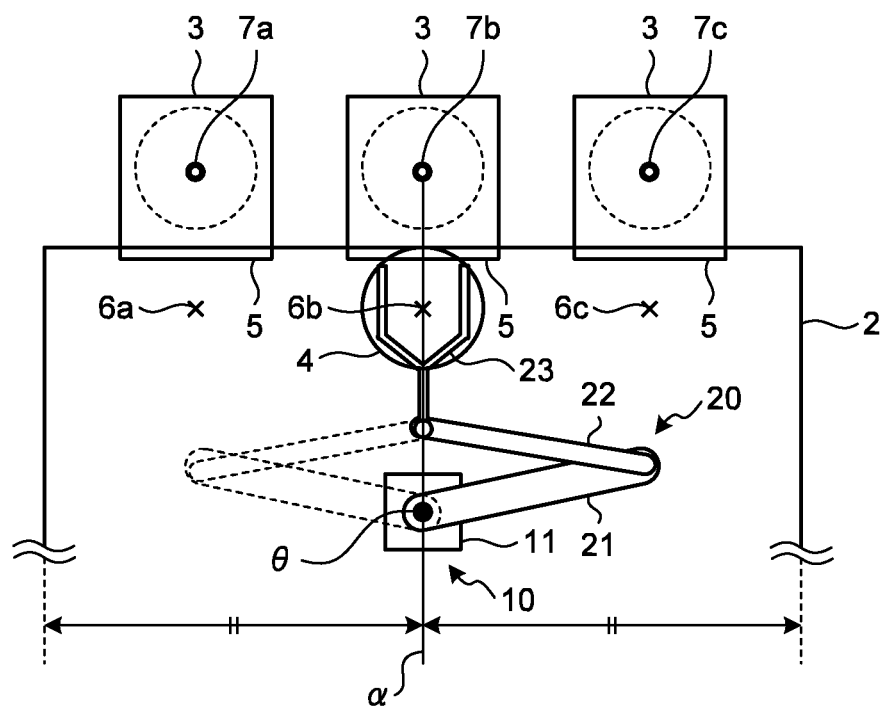
FIG. 1 is a top view of a conveyance room according to an embodiment.

A conveying system according to an embodiment will be described with reference to FIG. 1. FIG. 1 is a top view of a conveyance room 2 according to the present embodiment. In FIG. 1, a part of the shapes is simplified so as to facilitate explanation thereof.

As illustrated in FIG. 1, an opening and closing device 5 is arranged in a manner parallel to the conveyance room 2 as a transfer position into and out of which a laminated workpiece (hereinafter, referred to as a "wafer 4"), such as a semiconductor wafer and a liquid crystal panel, is conveyed. Furthermore, a conveying robot 10 is arranged in the conveyance room 2.

The conveyance room 2 is a clean room referred to as an equipment front end module (EFEM). The conveyance room 2 is provided with a filter (not illustrated) that purifies a gas on the upper part thereof. A clean air current purified by the filter and flowing downward makes the inside of the housing locally cleaned.

The opening and closing device 5 opens and closes a lid provided to a container 3 and is arranged at an opening provided to a side wall of the conveyance room 2. The opening and closing device 5 is referred to as a load port or a FOUP opener, for example, and is typically a device conforming to semiconductor equipment and materials international (SEMI) standards.

The container 3 is a box container capable of storing therein a plurality of wafers 4 in a multistage manner in the height direction and is a device referred to as a front-opening unified pod (FOUP) specified in the SEMI standards, for example.

The container 3 is placed on the opening and closing device 5 such that the lid of the container 3 faces the conveyance room 2. A movable body provided to the opening and closing device 5 descends in a sliding manner in the conveyance room 2 while holding the lid, thereby opening the lid. A circle indicated by a dashed line in each container 3 represents a storage space for the wafer 4.

The conveying robot 10 can hold the wafer 4 serving as an object to be conveyed. Specifically, the conveying robot 10 includes a base unit 11 and an arm unit 20.

The arm unit 20 includes a robot hand (hereinafter, referred to as a "hand 23") capable of holding the wafer 4 serving as an object to be conveyed. The arm unit 20 is supported rotatably in the horizontal direction on the top of the base unit 11 including a raising and lowering mechanism.

Specifically, the base end of a first arm 21 is rotatably connected to the top of the base unit 11, and the base end of a second arm 22 is rotatably connected to the top of the front end of the first arm 21. Furthermore, the hand 23 is rotatably connected to the front end of the second arm 22. These components can rotate with respect to one another.

With this configuration, the conveying robot 10 can remove the wafer 4 from the container 3 to place the wafer 4 on the hand 23, transfer the wafer 4 to a predetermined processing room (not illustrated), and convey the wafer 4 to a target position by moving up and down and rotating the arm unit 20. The arm unit 20 will be described later in detail with reference to FIG. 2.

To cause the hand 23 of the conveying robot 10 to enter a transfer position, such as the container 3 and the processing room, the conveying robot 10 moves the hand 23 in a linear trajectory from a predetermined position (hereinafter, referred to as a "standby position") provided outside of the transfer position. While an explanation will be made of the case where the transfer position is the container 3, the transfer position may be the processing room or an aligner.

The conveying robot 10, for example, moves the hand 23 from a standby position 6b (refer to a cross in FIG. 1) to a transfer position 7b of the wafer 4 (refer to a circle in FIG. 1) in a linear trajectory (hereinafter, referred to as a "transfer trajectory"), thereby transferring the wafer 4 into the container 3. While the standby position 6b indicated by the cross and the transfer position 7b indicated by the circle as reference positions are the center position of the wafer 4 to be placed onto the hand 23, the reference position may be provided to any part of the hand 23.

The container 3 positioned in the middle among three containers 3 is provided such that a rotation axis 8 of the conveying robot 10 is positioned on an extension of a transfer trajectory (6b-7b). The rotation axis θ of the conveying robot 10 corresponds to a rotor shaft to which the base end of the first arm 21 is rotatably connected on the top of the base unit 11.

The conveyance room 2 is in a rectangular shape viewed from the top, and the conveying robot 10 is arranged such that the rotation axis θ is located on a line α connecting midpoints of long sides in the conveyance room 2. The containers 3 arranged along the outside of the long side are provided in a manner symmetric with respect to the line α connecting the midpoints.

In this case, the conveying robot 10 can allow the arm unit 20 to take two postures symmetric with respect to the transfer trajectory (6b-7b) as the posture (hereinafter, referred to as a "standby posture") of the arm unit 20 at the standby position 6b corresponding to the container 3 positioned in the middle. Specifically, there are two standby postures of a standby posture of the arm unit 20 indicated by a solid line and a standby posture indicated by a dashed line.

By contrast, the two containers 3 other than the container 3 positioned in the middle are provided at such positions that the rotation axis θ of the conveying robot 10 is not located on an extension of each transfer trajectory (6a-7a and 6c-7c), that is, at offset positions.

In the conventional conveying system, a transfer position, such as a container and a processing room, is provided at a position offset from a rotation axis of a conveying robot. When the conveying robot is caused to take a standby posture so as to cause a hand to enter the transfer position provided at the offset position, the posture of an arm unit of the conveying robot is determined to be one posture. Therefore, to access a plurality of transfer positions sequentially, a change in the posture of the arm unit tends to be made large, resulting in reduction in throughput.

To address this, when the hand 23 is caused to enter the container 3 provided such that the rotation axis θ of the conveying robot 10 is positioned on an extension of a transfer trajectory, the conveying system according to the present embodiment selects a standby posture with which a change in the posture of the arm unit 20 is smaller from a plurality of standby postures.

Specifically, a robot control device controls motions of the conveying robot 10. The robot control device controls the motions of the conveying robot 10 based on instruction data that instructs the conveying robot 10 in advance to make predetermined motions.

The conveying system determines whether the hand 23 is being caused to enter the container 3 provided such that the rotation axis θ of the conveying robot 10 is positioned on an extension of a transfer trajectory based on the instruction data.

In other words, the conveying system determines whether a plurality of standby postures exist to be subsequently taken based on the instruction data. If a plurality of subsequent standby postures exist, the conveying system selects a standby posture that can be taken in a process with which a change in the posture of the arm unit 20 is the smallest. The conveying system then moves the conveying robot 10 to the standby posture thus selected. In the present embodiment, a plurality of standby postures serving as candidates for the posture of the arm unit 20 at the subsequent transfer position correspond to candidate postures.

Furthermore, if a plurality of subsequent standby postures exist, the conveying system switches from a rectangular coordinate system to a cylindrical coordinate system to generate a trajectory along which the conveying robot 10 is moved. As a result, it is possible to reduce time for generating the trajectory to cause the hand 23 to enter the container 3 provided such that the rotation axis θ of the conveying robot 10 is positioned on an extension of a transfer trajectory.

Thus, the conveying system according to the present embodiment can increase throughput.

While the shape of the conveyance room 2 illustrated in FIG. 1 is a rectangular, it is not limited thereto. The shape of the conveyance room 2 may be a polygon or a circle, for example. Furthermore, while an explanation will be made of the case where the arm unit 20 of the conveying robot 10 moves in the horizontal direction, the conveying system moves the conveying robot 10 in the vertical direction besides the horizontal direction simultaneously.

Figure 2:
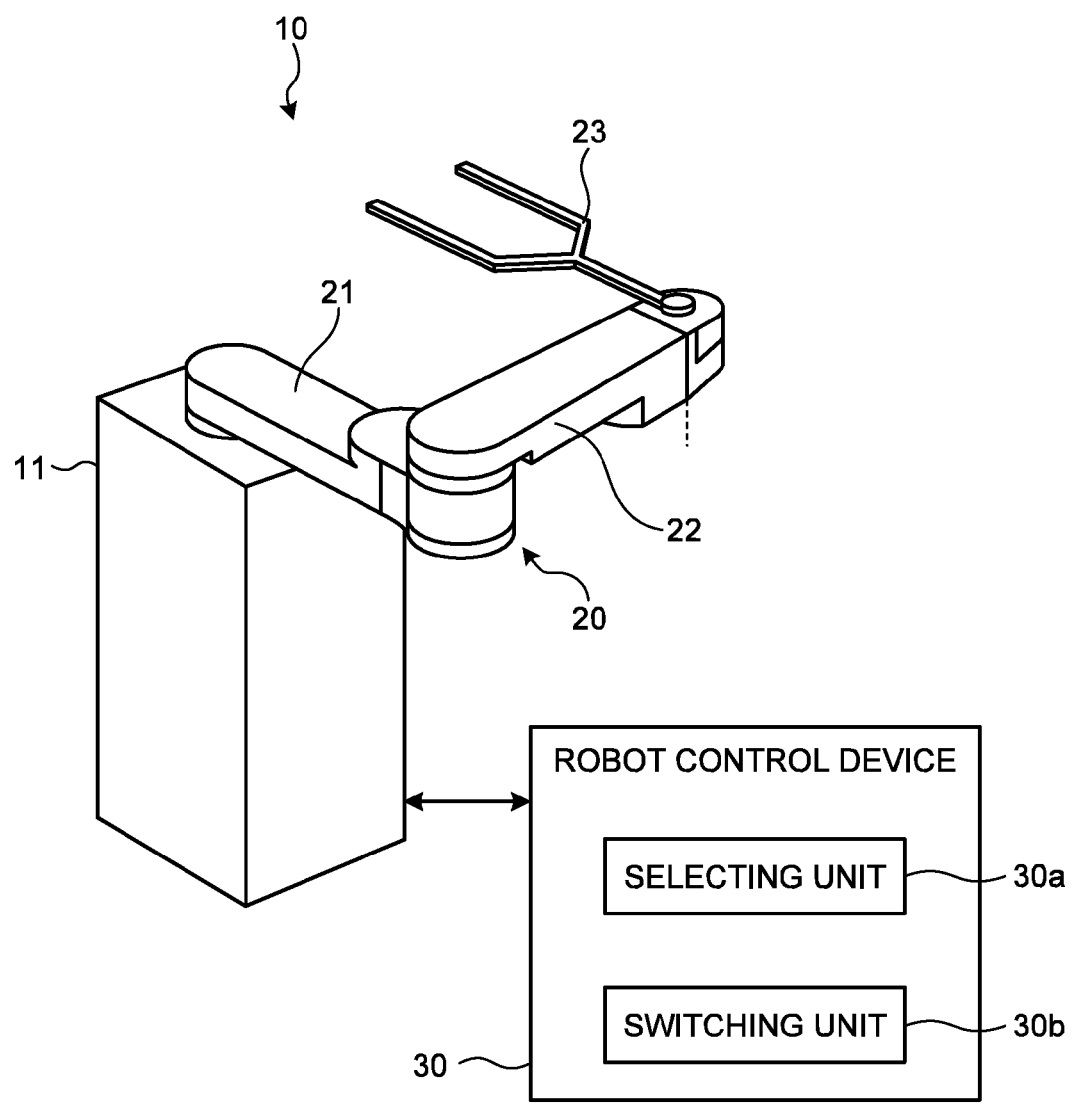
FIG. 2 is a schematic perspective view of a conveying robot according to the present embodiment.

The conveying robot 10 according to the present embodiment will now be described in detail with reference to FIG. 2. FIG. 2 is a schematic perspective view of the conveying robot 10 according to the present embodiment. As illustrated in FIG. 2, a robot control device 30 is connected to the conveying robot 10, and the robot control device 30 and the conveying robot 10 can communicate with each other.

The conveying robot 10 is a horizontal articulated robot including two arms that rotate in the horizontal direction about vertical axes. Specifically, the conveying robot 10 includes the base unit 11 and the arm unit 20.

The arm unit 20 includes the first arm 21, the second arm 22, and the hand 23 capable of holding the wafer 4 serving as an object to be conveyed. The arm unit 20 is supported rotatably in the horizontal direction on the top of the base unit 11 including the raising and lowering mechanism.

Specifically, the base end of the first arm 21 is rotatably connected to the top of the base unit 11, and the base end of the second arm 22 is rotatably connected to the top of the front end of the first arm 21. Furthermore, the hand 23 is rotatably connected to the front end of the second arm 22. These components can rotate with respect to one another and are rotated by a mechanism formed of a motor and a reducer, for example. The mechanism formed of a motor and a reducer, for example, may be provided to the base unit 11 or housed in the arm unit 20.

The conveying robot 10 rotates the first arm 21, the second arm 22, and the hand 23, thereby moving the hand 23 to a target position. Furthermore, the conveying robot 10 moves the first arm 21 and the second arm 22 synchronously, thereby moving the hand 23 in a linear manner.

The raising and lowering mechanism included in the base unit 11 includes a linear motion guide, a ball screw, and a motor. The raising and lowering mechanism converts a rotational motion of the motor into a linear motion, thereby moving the arm unit 20 up and down along the vertical direction. While the raising and lowering mechanism moves the arm unit 20 up and down using the ball screw, the raising and lowering mechanism may move the arm unit 20 up and down using a belt provided along the vertical direction.

With this configuration, the conveying robot 10 can remove the wafer 4 from the container 3 to place the wafer 4 on the hand 23, transfer the wafer 4 to a predetermined processing room (not illustrated), and convey the wafer 4 to a target position by moving up and down and rotating the arm unit 20.

The processing room is a room arranged in a manner parallel to the conveyance room 2 and provided with a device that performs predetermined processing, such as chemical vapor deposition (CVD), exposure, etching, and asking, on the wafer 4.

While the explanation is made of the case where the conveying robot 10 according to the present embodiment is a triaxial horizontal articulated robot formed of the first arm 21, the second arm 22, and the hand 23, it is not limited thereto. The conveying robot 10 may be a horizontal articulated robot having four or more motion axes.

To cause the hand 23 to enter the container 3 provided such that the rotation axis θ of the horizontal articulated robot having four or more axes is positioned on an extension of a transfer trajectory, the conveying system selects a standby posture from two or more patterns of standby postures.

The conveying robot 10 may be a dual-arm robot having two arm units 20 or may include three or more arm units 20. If the conveying robot 10 is a dual-arm robot, the conveying robot 10 can perform two operations simultaneously in parallel, such as removing the wafer 4 from a predetermined conveyance position with a first arm unit 20 and conveying another wafer 4 into the conveyance position with a second arm unit 20. Furthermore, in the conveying robot 10, one second arm unit 22 may be provided with two or more hands 23. In this case, the two or more hands 23 are provided coaxially in a manner rotatable independently of one another.

The robot control device 30 is a controller that controls motions of the conveying robot 10 and includes a selecting unit 30a and a switching unit 30b. The conveying robot 10 removes the wafer 4 from the container 3 to place the wafer 4 on the hand 23 and conveys the wafer 4 to a target position by moving up and down and rotating the arm unit 20 in accordance with instructions issued from the robot control device 30.

The selecting unit 30a determines whether a plurality of standby postures exist to be subsequently taken based on the instruction data, for example. If a plurality of subsequent standby postures exist, the selecting unit 30a performs processing for selecting a standby posture that can be taken in a process with which a change in the posture of the arm unit 20 is the smallest.

The selecting unit 30a, for example, calculates a rotation amount of each articulated shaft of the arm unit 20 to select a standby posture with which the rotation amount is the smallest. Furthermore, the selecting unit 30a may select a standby posture by taking into account required power for the mechanism formed of a motor and a reducer, for example.

If a plurality of subsequent standby postures exist, the switching unit 30b performs processing for switching from the rectangular coordinate system to the cylindrical coordinate system. The robot control device 30 then generates a trajectory along which the conveying robot 10 is moved to a standby posture with which a change in the posture of the arm unit 20 is the smallest using the cylindrical coordinate system. In addition, the robot control device 30 performs processing for transmitting motion instructions to the conveying robot 10 based on the trajectory thus generated.

The conveying robot 10 then moves the arm unit 20 to a standby posture with which a change in the posture of the arm unit 20 is the smallest in accordance with the instructions transmitted from the robot control device 30.

The robot control device 30 performs posture selection processing when the conveying robot 10 changes its posture into a reference posture. However, the timing of the posture selection processing is not limited thereto. The selecting unit 30a may perform the posture selection processing when the conveying robot 10 causes the hand 23 to enter the transfer position of the container 3.

The reference position of the conveying robot 10 will now be described in detail with reference to FIG. 3. FIG. 3 is a view for explaining the reference posture of the conveying robot 10.

As illustrated in FIG. 3, in the reference posture of the conveying robot 10, the whole arm unit 20 is folded so as to be made the shortest with the second arm 22 and the hand 23 stacked on the first arm 21. Furthermore, in the reference posture of the conveying robot 10, each axis of the arm unit 20 is parallel to the lateral direction (an arrow e in FIG. 3) of the conveyance room 2. The robot control device 30 temporarily returns the conveying robot 10 to the reference posture and moves the conveying robot 10 to a predetermined posture.

A change in the posture of the conveying robot 10 from the reference posture (refer to FIG. 3) will now be described in detail with reference to FIG. 4A to FIG. 4D. FIG. 4A to FIG. 4D are a first view to a fourth view, respectively, for explaining a trajectory of the conveying robot 10.

Figure 4A:
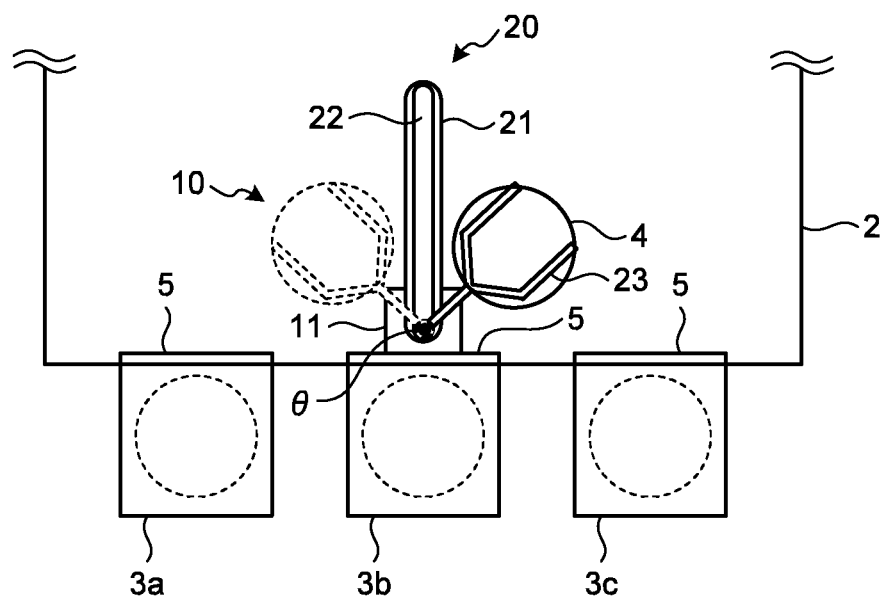
FIG. 4A is a first view for explaining a trajectory of the conveying robot.
Figure 4B:
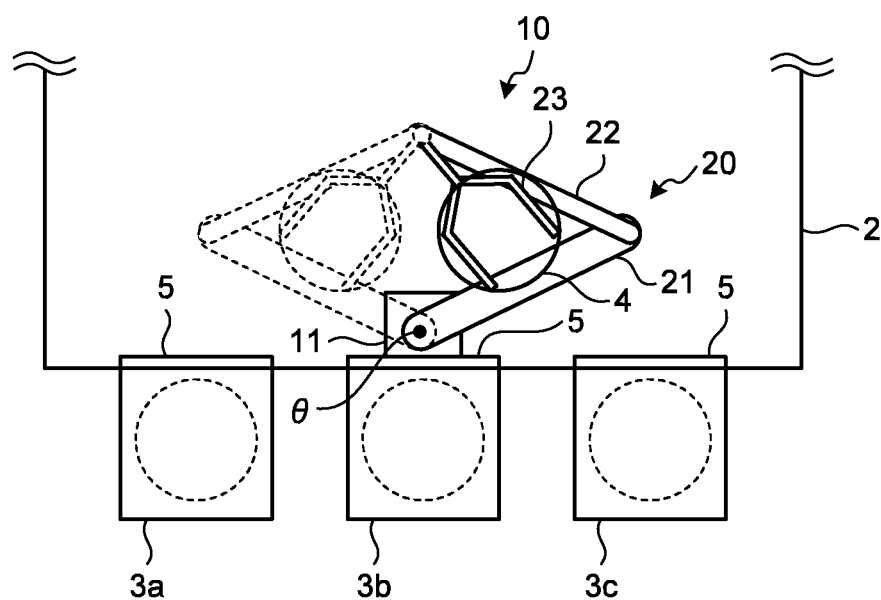
FIG. 4B is a second view for explaining the trajectory of the conveying robot.
Figure 4C:
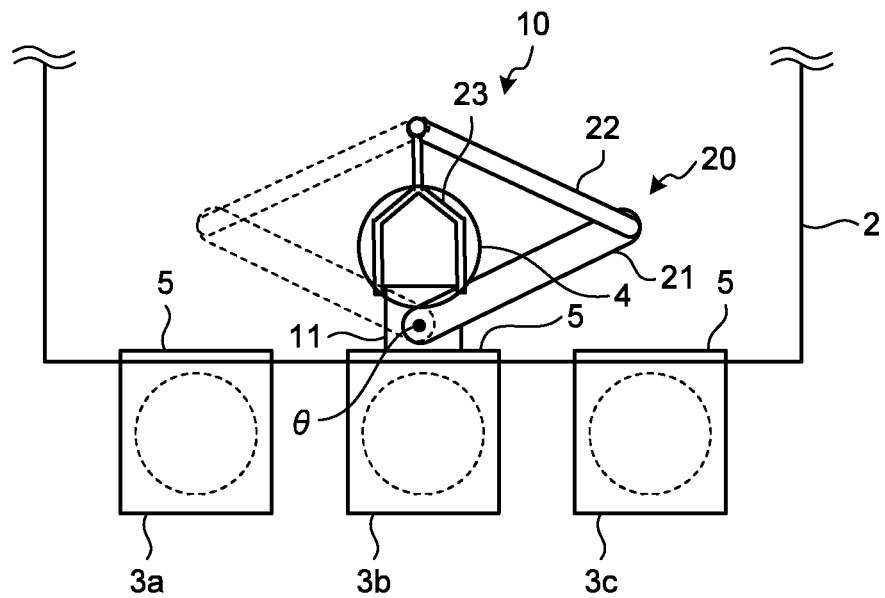
FIG. 4C is a third view for explaining the trajectory of the conveying robot.
Figure 4D:
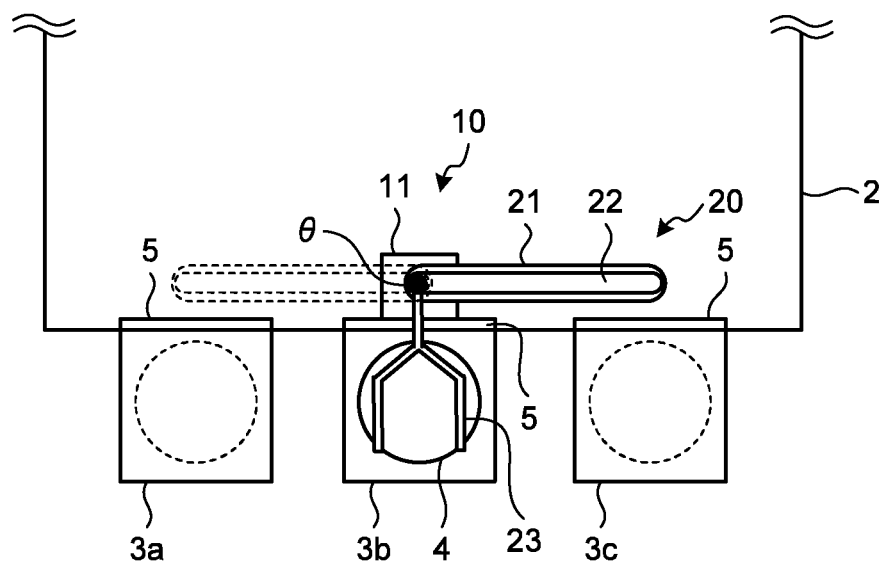
FIG. 4D is a fourth view for explaining the trajectory of the conveying robot.

An explanation will be made of the case where the hand 23 is caused to enter a container 3b from the reference posture (refer to FIG. 4D). The container 3b is provided such that the rotation axis 8 of the conveying robot 10 is positioned on an extension of a transfer trajectory. Therefore, there are two standby postures of the arm unit 20 at a standby position corresponding to the container 3b that are symmetric with respect to the transfer trajectory as illustrated in FIG. 4C.

The reference posture serving as the starting point of the trajectory of the conveying robot 10 is also symmetric with respect to the transfer trajectory with the arm unit 20 of the conveying robot 10 positioned on the extension of the transfer trajectory corresponding to the container 3b. Therefore, there are two trajectories of the conveying robot 10 that are symmetric with respect to the transfer trajectory as illustrated in FIG. 4A and FIG. 4B. Thus, the changes in the posture of the arm unit 20 are the same in both the trajectories.

In this case, in selection of a standby posture that can be taken in a process with which a change in the posture of the arm unit 20 is the smallest from a plurality of standby postures to be subsequently taken, the selecting unit 30a may select either of the standby postures.

Figure 5:
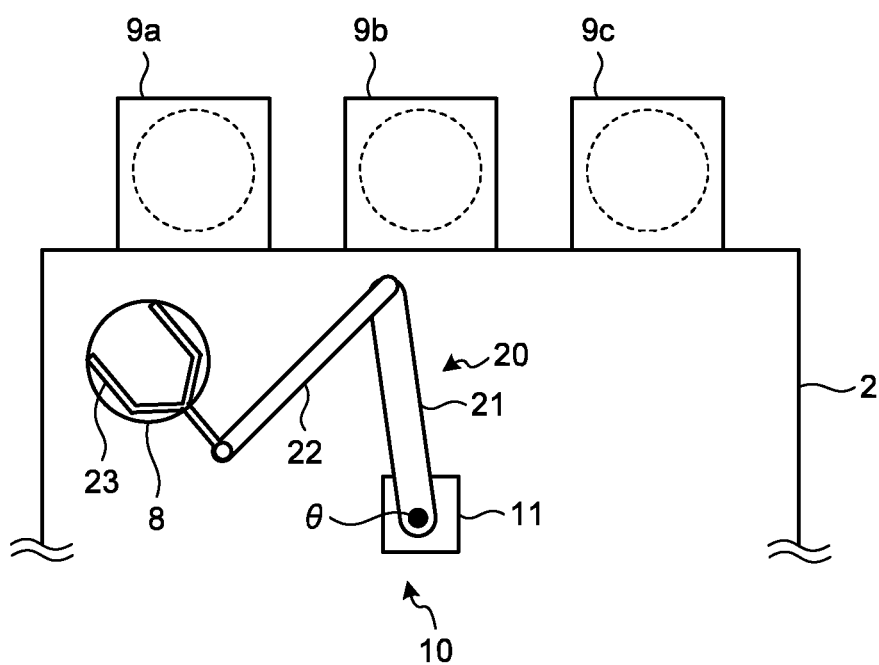
FIG. 5 is a view for explaining an offset position of the conveying robot.

A change in the posture of the conveying robot 10 from an offset position will now be described in detail with reference to FIG. 5, FIG. 6A to FIG. 6C, and FIG. 7A to FIG. 7C. FIG. 5 is a view for explaining the offset position of the conveying robot 10. FIG. 6A to FIG. 6C and FIG. 7A to FIG. 7C are views for explaining a trajectory of the conveying robot 10.

As illustrated in FIG. 5, in addition to the container 3 and processing rooms 9a to 9c, the conveyance room 2 may be provided with another device, such as an aligner 8 that detects and adjusts (aligns) the directivity of the wafer 4.

In the conveyance room 2, the conveying robot 10 removes the wafer 4 stored in the container 3 and conveys the wafer 4 to the aligner 8. After the aligner 8 aligns the wafer 4, the conveying robot 10 conveys the wafer 4 thus aligned to the processing rooms 9a to 9c. The conveying robot 10 then restores the wafer 4 on which processing is performed in the processing rooms 9a to 9c to the container 3. A circle indicated by a dashed line in each of the processing rooms 9a to 9c represents a transfer position of the wafer 4.

An explanation will be made of the case where the hand 23 is caused to enter the processing room 9b from the aligner 8 provided at a position offset from the rotation axis θ of the conveying robot 10 (refer to FIG. 6C and FIG. 7C). The processing room 9b is provided such that the rotation axis θ of the conveying robot 10 is positioned on an extension of a transfer trajectory.

A first pattern of a trajectory of the conveying robot 10 will now be described with reference to FIG. 6A to FIG. 6C. To change the posture as illustrated in FIG. 6A, the conveying robot 10 folds the arm unit 20 such that the second arm 22 is stacked on the first arm 21.

Subsequently, the conveying robot 10 rotates the first arm 21 and the second arm 22 thus folded in a direction of an arrow 100 and rotates the hand 23 on which the wafer 4 is placed in a direction of an arrow 101.

Figure 6C:
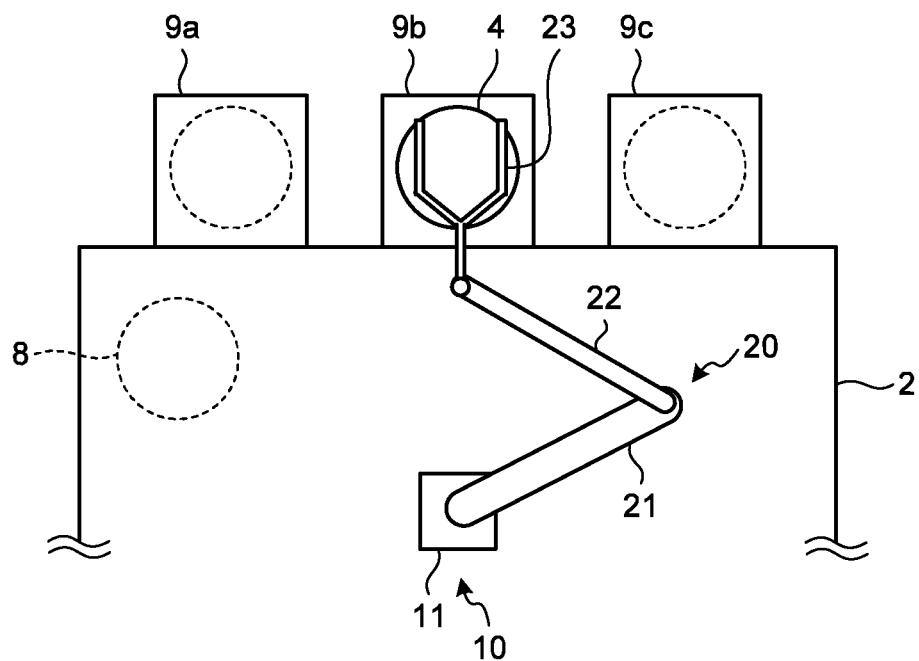
FIG. 6C is a seventh view for explaining the trajectory of the conveying robot.
Figure 7A:
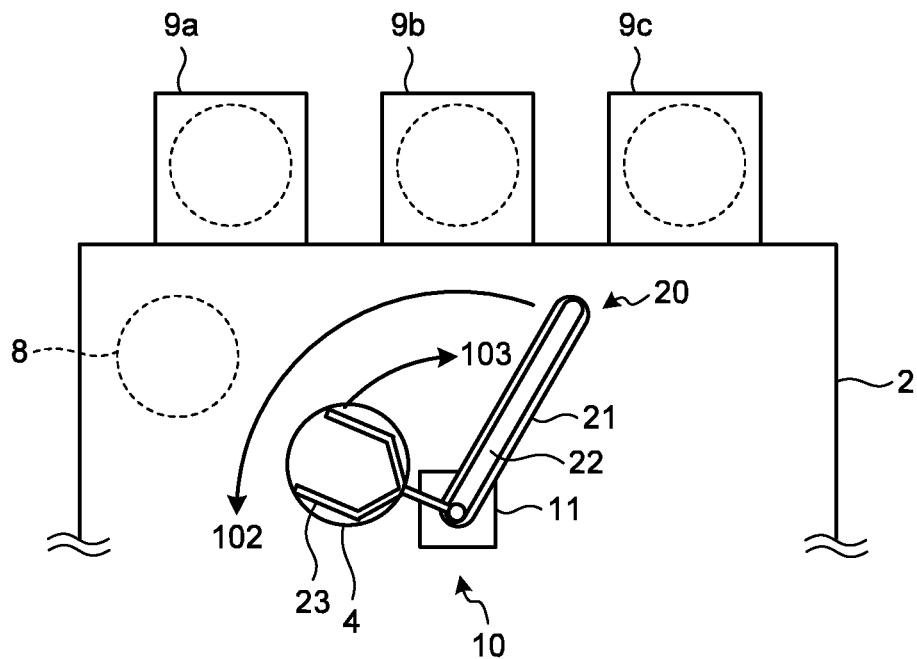
FIG. 7A is an eighth view for explaining the trajectory of the conveying robot.

Thus, the arm unit 20 is in a standby posture at a standby position corresponding to the processing room 9b as illustrated in FIG. 6B. Subsequently, the conveying robot 10 causes the hand 23 to enter the processing room 9b from the standby posture (refer to FIG. 6C).

A second pattern of a trajectory of the conveying robot 10 will now be described with reference to FIG. 7A to FIG. 7C. To change the posture as illustrated in FIG. 7A, the conveying robot 10 folds the arm unit 20 such that the second arm 22 is stacked on the first arm 21 in the same manner as in the first pattern.

Subsequently, the conveying robot 10 rotates the first arm 21 and the second arm 22 thus folded in a direction of an arrow 102 and rotates the hand 23 on which the wafer 4 is placed in a direction of an arrow 103.

Figure 7B:
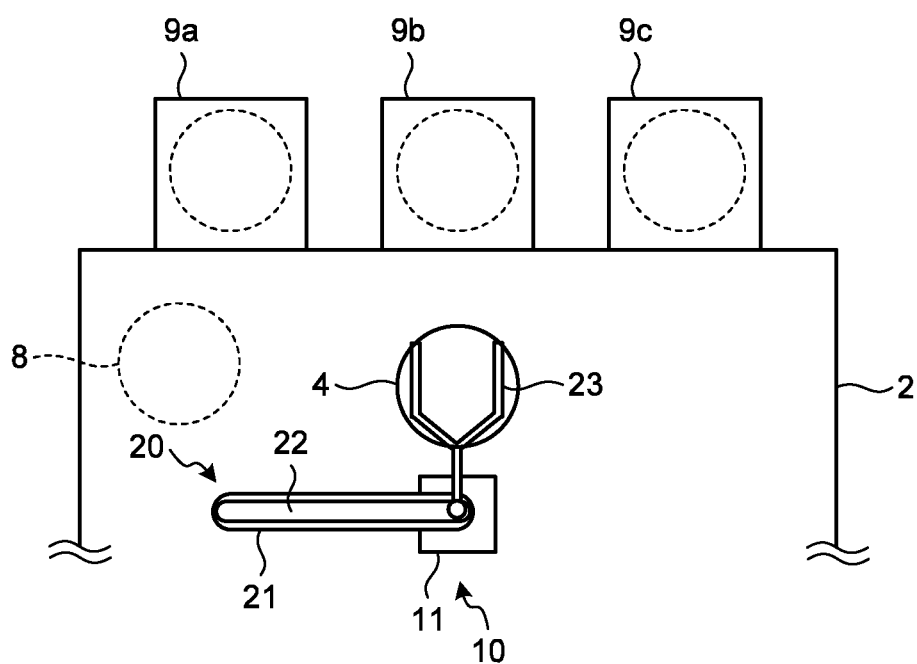
FIG. 7B is a ninth view for explaining the trajectory of the conveying robot.
Figure 7C:
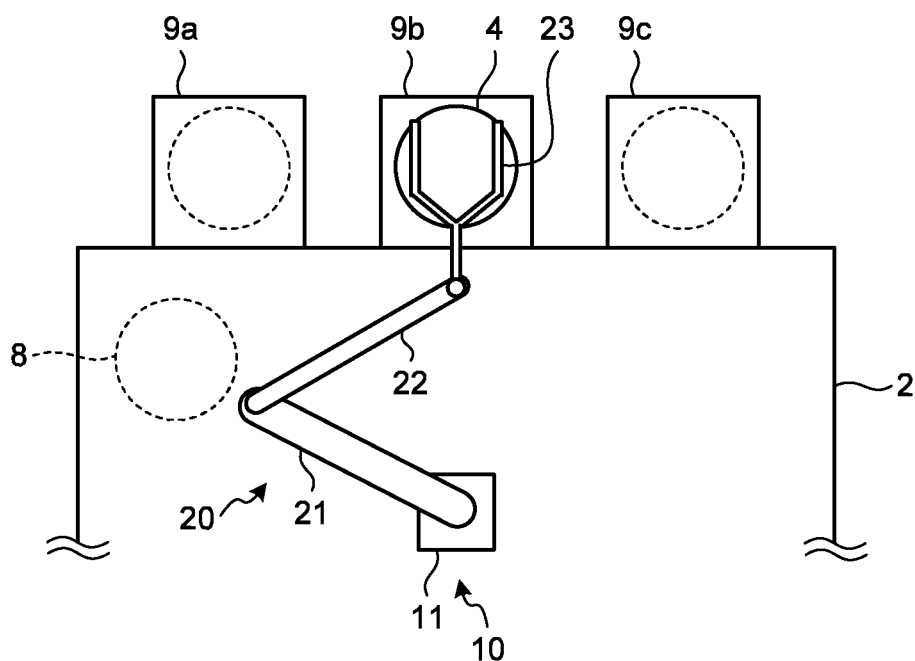
FIG. 7C is a tenth view for explaining the trajectory of the conveying robot.

Thus, the arm unit 20 is in a standby posture at a standby position corresponding to the processing room 9b as illustrated in FIG. 7B. Subsequently, the conveying robot 10 causes the hand 23 to enter the processing room 9b from the standby posture (refer to FIG. 7C).

In comparison of the changes in the posture between two standby postures of the first pattern and the second pattern based on FIG. 6A and FIG. 7A, changes in the posture of the hand 23 (the arrow 101 and the arrow 103) are the same. By contrast, in terms of changes in the posture of the first arm 21 and the second arm 22 (the arrow 100 and the arrow 102), the change in the first pattern is smaller than that in the second pattern.

In this case, the selecting unit 30a selects the first pattern in which the change in the posture of the arm unit 20 is smaller from the two standby postures to be subsequently taken.

The selecting unit 30a selects a standby posture that can be taken in a process with which a change in the posture of the arm unit 20 is smaller from the standby postures to be subsequently taken. However, the selection method is not limited thereto, and the selecting unit 30a may determine the subsequent standby posture based on a change in the posture of the conveying robot 10 to a standby posture to be taken after the subsequent standby posture or to a standby posture to be taken thereafter, for example.

Specifically, after the hand 23 is caused to enter a predetermined transfer position based on the instruction data and the like, the conveying system can further acquire a position to which the conveying robot 10 is moved. An assumption is made that the instruction data instructs the conveying robot 10 to convey the wafer 4 from the aligner 8 to the processing room 9b and then move to fetch the wafer 4 in the processing room 9a, for example.

In this case, in terms of a change in the posture of the arm unit 20 moving from the aligner 8 to the processing room 9b, the change is smaller in the first pattern. By contrast, in terms of a change in the posture of the arm unit 20 moving from the processing room 9b to the processing room 9a, the change is smaller in the second pattern. Therefore, the selecting unit 30a may select the standby posture of the second pattern in consideration of a change in the posture to the standby posture taken after the subsequent standby posture.

Figure 8:
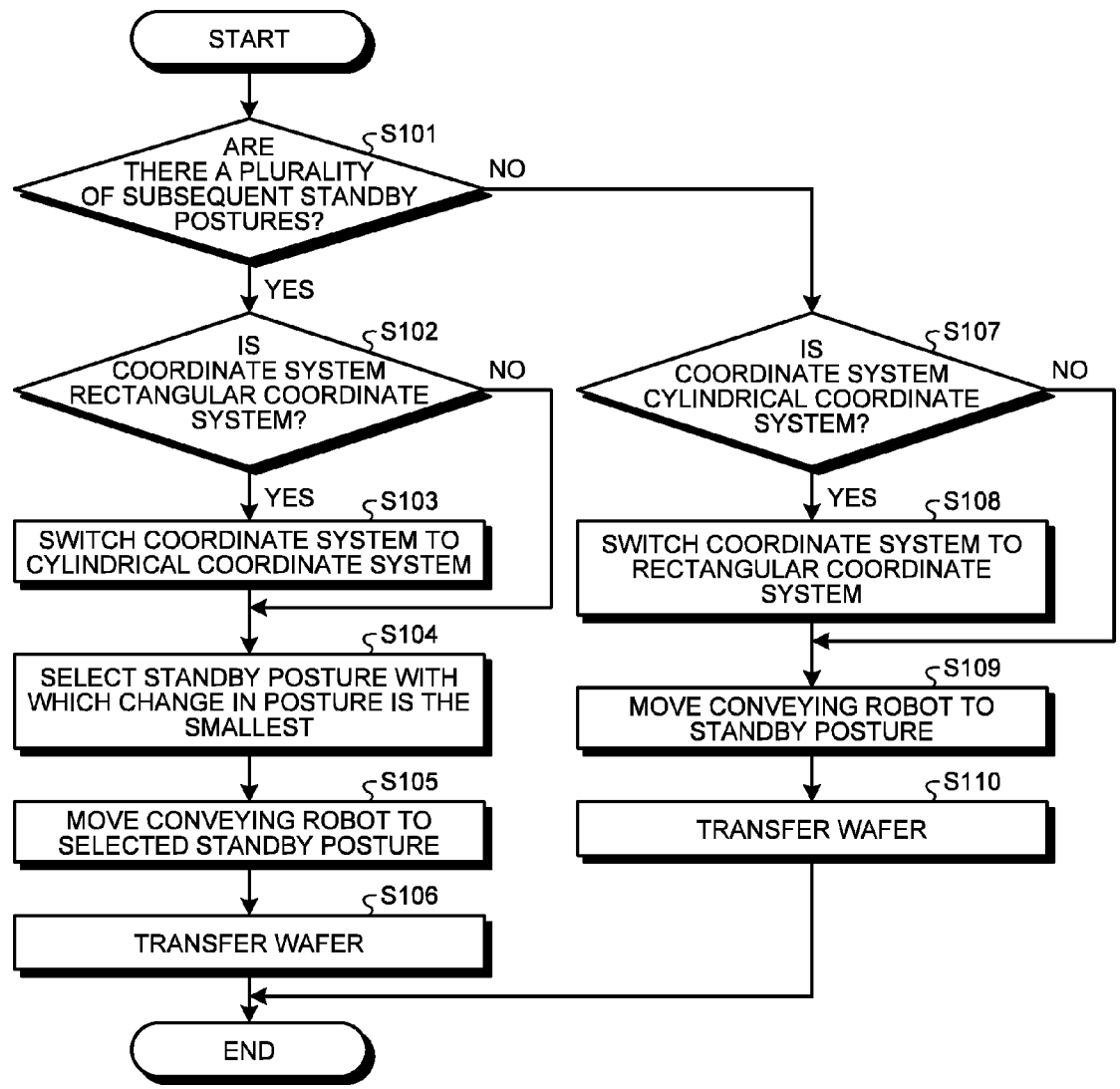
FIG. 8 is a flowchart of a process of posture selection processing.

The posture selection processing performed by the robot control device 30 will now be described in detail with reference to FIG. 8. FIG. 8 is a flowchart of a process of the posture selection processing.

The robot control device 30 performs the posture selection processing illustrated in FIG. 8 at a predetermined timing. The robot control device 30 may perform the posture selection processing at a timing when the conveying robot 10 changes its posture into the reference posture or at a timing when the conveying robot 10 causes the hand 23 to enter the transfer position of the container 3, for example.

As illustrated in FIG. 8, the selecting unit 30a determines whether a plurality of standby postures exist to be subsequently taken (Step S101). If a plurality of subsequent standby postures exist (Yes at Step S101), the switching unit 30b performs the following processing.

To generate a trajectory of the conveying robot 10, the switching unit 30b determines whether a trajectory is being generated using the rectangular coordinate system (Step S102). If the trajectory is being generated using the rectangular coordinate system (Yes at Step S102), the switching unit 30b switches the coordinate system to the cylindrical coordinate system (Step S103).

By contrast, if the trajectory is not being generated using the rectangular coordinate system (No at Step S102), the system control goes to Step S104.

Subsequently, the selecting unit 30a selects a standby posture that can be taken in a process with which a change in the posture of the arm unit 20 is the smallest from the standby postures (Step S104).

The robot control device 30 then generates a trajectory along which the conveying robot 10 is moved to a standby posture selected at Step S104 using the cylindrical coordinate system and moves the conveying robot 10 based on the trajectory thus generated (Step S105).

The robot control device 30 causes the hand 23 to enter the transfer position from the standby position at which the conveying robot 10 is in the standby posture, causes the hand 23 to perform transfer processing of the wafer 4 (Step S106), and terminates the series of processing.

If there are not a plurality of subsequent standby postures at Step S101 (No at Step S101), the switching unit 30b determines whether a trajectory is being generated using the cylindrical coordinate system to generate a trajectory of the conveying robot 10 (Step S107).

If the trajectory is being generated using the cylindrical coordinate system (Yes at Step S107), the switching unit 30b switches the coordinate system to the rectangular coordinate system (Step S108). By contrast, if the trajectory is not being generated using the cylindrical coordinate system (No at Step S107), the system control goes to Step S109.

The robot control device 30 then generates a trajectory along which the conveying robot 10 is moved to a standby posture using the rectangular coordinate system and moves the conveying robot 10 based on the trajectory thus generated (Step S109).

The robot control device 30 causes the hand 23 to enter the transfer position from the standby position at which the conveying robot 10 is in the standby posture, causes the hand 23 to perform transfer processing of the wafer 4 (Step S110), and terminates the series of processing.

Figure 9:
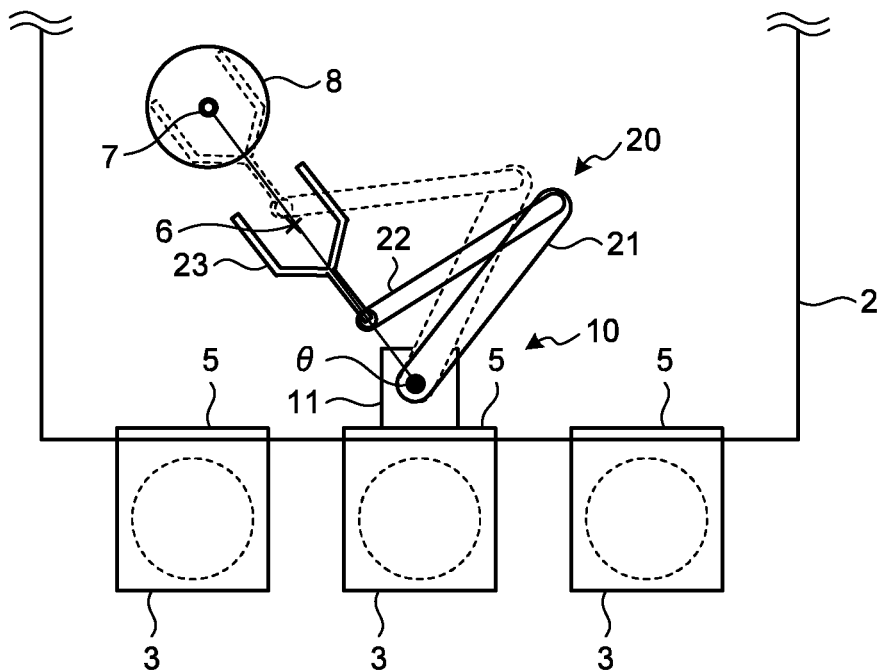
FIG. 9 is a view for explaining a transfer position.
Figure 10:
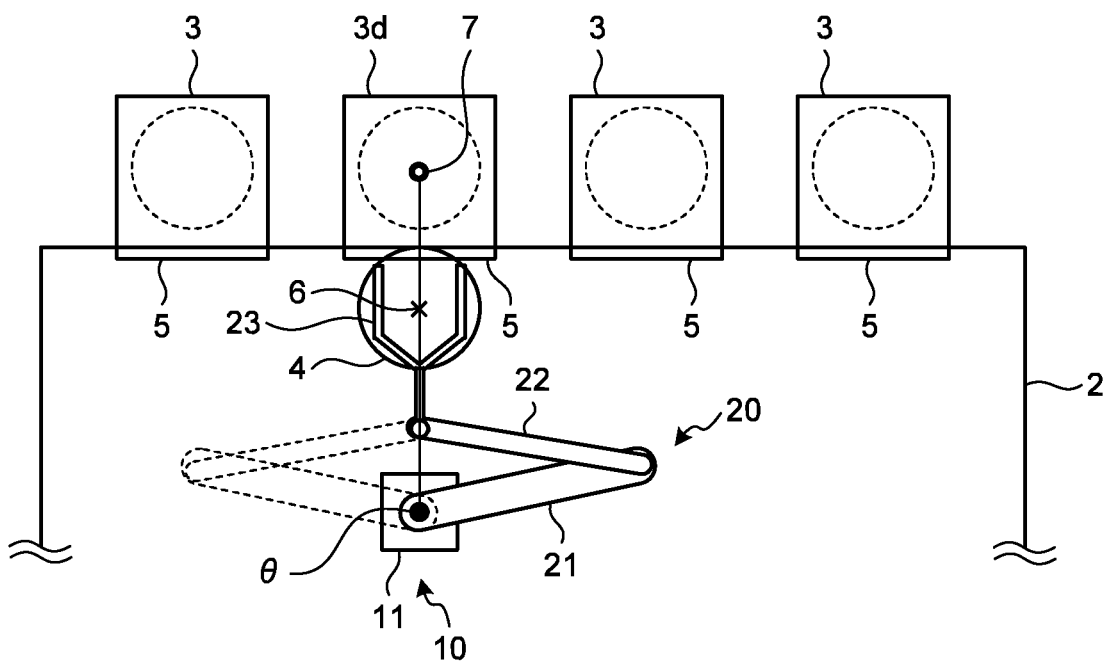
FIG. 10 is a top view of a conveyance room according to a modification.

The transfer position will now be described with reference to FIG. 9 and FIG. 10. FIG. 9 is a view for explaining the transfer position. FIG. 10 is a top view of a conveyance room 2 according to a modification.

While the container 3 and the processing rooms 9a to 9c arranged along the side wall of the conveyance room 2 have been explained as the transfer positions provided such that the rotation axis θ of the conveying robot 10 is positioned on an extension of a transfer trajectory in the conveying system according to the present embodiment, the transfer position is not limited thereto.

As illustrated in FIG. 9, for example, the present embodiment may be also applied to the case where the aligner 8 provided in the conveyance room 2 is provided such that the rotation axis θ of the conveying robot 10 is positioned on an extension of a line connecting a standby position 6 and a transfer position 7, that is, an extension of a transfer trajectory.

Furthermore, while the explanation has been made of the three containers 3 or the three processing rooms 9a to 9c arranged along the side wall of the conveyance room 2, the number of transfer positions is not limited thereto. Four of more transfer positions may be arranged.

As illustrated in FIG. 10, for example, the present embodiment may be applied to the case where four containers 3 are arranged along the side wall of the conveyance room 2 and a container 3d among the containers 3 is provided such that the rotation axis θ of the conveying robot 10 is positioned on an extension of a line connecting a standby position 6 and a transfer position 7, that is, an extension of a transfer trajectory.

As described above, to cause a hand to enter a transfer position provided such that a rotation axis of a conveying robot is positioned on an extension of a transfer trajectory, the conveying system according to the present embodiment selects a standby posture with which a change in the posture of an arm unit is smaller from a plurality of standby postures. Furthermore, if a plurality of subsequent standby postures exist, the conveying system switches from a rectangular coordinate system to a cylindrical coordinate system to generate a trajectory along which a conveying robot is moved. Thus, the conveying system according to the present embodiment can increase throughput.

Additional advantages and modifications will readily occur to those skilled in the art. Therefore, the invention in its broader aspects is not limited to the specific details and representative embodiment shown and described herein. Accordingly, various modifications may be made without departing from the spirit or scope of the general inventive concept as defined by the appended claims and their equivalents.

What is claimed is:

1. A conveying system comprising:
   a robot that includes an arm unit formed of a hand and a plurality of arms connected rotatably with respect to one another, and a base unit, a first arm of the plurality of arms being connected on a rear end side thereof to the base unit rotatably about a rotation axis and the hand being rotatably connected to a second arm of the plurality of arms on a front end side of the second arm; and
   a controller configured to control a motion of the robot, the controller being further configured to:
      perform posture selection to select one of the plurality of standby postures,
      generate a trajectory from a current posture of the robot to the selected standby posture utilizing a first coordinate system,
      switch, by a switching unit, from the first coordinate system to a second coordinate system,
      generate a trajectory from the standby posture to the target posture utilizing the second coordinate system,
      wherein the first coordinate system is one of a rectangular coordinate system and a cylindrical coordinate system, and the second coordinate system is the other of the rectangular coordinate system and the cylindrical coordinate system.

2. The conveying system according to claim 1, wherein the conveying system has:
   a first transfer position that is a transfer position for a workpiece accessible by the hand under the cylindrical coordinate system; and
   a second transfer position that is a transfer position for a workpiece accessible by the hand under the rectangular coordinate system, and
   the switching unit switches, when the hand is moved between the first transfer position and the second transfer position, the cylindrical coordinate system and the rectangular coordinate system at a timing when the hand is positioned at a position other than the first transfer position and the second transfer position.

3. The conveying system according to claim 2, wherein the switching unit switches, when the hand is moved between the first transfer position and the second transfer position, the cylindrical coordinate system and the rectangular coordinate system at a timing when the hand is positioned at a standby position corresponding to each of the transfer positions.

4. The conveying system according to claim 3, wherein
the controller comprises a selecting unit that derives, when the hand is moved between the first transfer position and the second transfer position, the plurality of standby postures serving as candidates for a posture of the arm unit at a subsequent transfer position and performs the posture selection by selecting one of the standby postures with which a change amount from a posture of the arm unit at a present transfer position is the smallest as the posture of the arm unit at the subsequent transfer position.

5. The conveying system according to claim 4, wherein the selecting unit derives two standby postures whose angles between the first arm and the second arm are different from each other and performs the posture selection by selecting one of the two standby postures with which a change amount from an angle between the first arm and the second arm at the present transfer position is smaller as the posture of the arm unit at the subsequent transfer position.

6. The conveying system according to claim 5, further comprising:
a conveyance room in which the robot is arranged and that keeps atmosphere of an area in which the robot conveys a workpiece clean, wherein
the conveyance room is provided with a load port arranged at the first transfer position and a plurality of load ports arranged at the second transfer position in a manner parallel to a planar wall.

7. The conveying system according to claim 4, further comprising:
a conveyance room in which the robot is arranged and that keeps atmosphere of an area in which the robot conveys a workpiece clean, wherein
the conveyance room is provided with a load port arranged at the first transfer position and a plurality of load ports arranged at the second transfer position in a manner parallel to a planar wall.

8. The conveying system according to claim 3, further comprising:
a conveyance room in which the robot is arranged and that keeps atmosphere of an area in which the robot conveys a workpiece clean, wherein
the conveyance room is provided with a load port arranged at the first transfer position and a plurality of load ports arranged at the second transfer position in a manner parallel to a planar wall.

9. The conveying system according to claim 2, wherein the switching unit switches, when the hand is moved between the first transfer position and the second transfer position, the cylindrical coordinate system and the rectangular coordinate system at a timing when the arm unit is in a reference posture.

10. The conveying system according to claim 9, wherein
the controller comprises a selecting unit that derives, when the hand is moved between the first transfer position and the second transfer position, the plurality of standby postures serving as candidates for a posture of the arm unit at a subsequent transfer position and performs the posture selection by selecting one of the standby postures with which a change amount from a posture of the arm unit at a present transfer position is the smallest as the posture of the arm unit at the subsequent transfer position.

11. The conveying system according to claim 10, wherein the selecting unit derives two standby postures whose angles between the first arm and the second arm are different from each other and performs the posture selection by selecting one of the two standby postures with which a change amount from an angle between the first arm and the second arm at the present transfer position is smaller as the posture of the arm unit at the subsequent transfer position.

12. The conveying system according to claim 11, further comprising:
a conveyance room in which the robot is arranged and that keeps atmosphere of an area in which the robot conveys a workpiece clean, wherein
the conveyance room is provided with a load port arranged at the first transfer position and a plurality of load ports arranged at the second transfer position in a manner parallel to a planar wall.

13. The conveying system according to claim 10, further comprising:
a conveyance room in which the robot is arranged and that keeps atmosphere of an area in which the robot conveys a workpiece clean, wherein
the conveyance room is provided with a load port arranged at the first transfer position and a plurality of load ports arranged at the second transfer position in a manner parallel to a planar wall.

14. The conveying system according to claim 9, further comprising:
a conveyance room in which the robot is arranged and that keeps atmosphere of an area in which the robot conveys a workpiece clean, wherein
the conveyance room is provided with a load port arranged at the first transfer position and a plurality of load ports arranged at the second transfer position in a manner parallel to a planar wall.

15. The conveying system according to claim 2, wherein
the controller comprises a selecting unit that derives, when the hand is moved between the first transfer position and the second transfer position, the plurality of standby postures serving as candidates for a posture of the arm unit at a subsequent transfer position and performs the posture selection by selecting one of the standby postures with which a change amount from a posture of the arm unit at a present transfer position is the smallest as the posture of the arm unit at the subsequent transfer position.

16. The conveying system according to claim 15, wherein the selecting unit derives two standby postures whose angles between the first arm and the second arm are different from each other and performs the posture selection by selecting one of the two standby postures with which a change amount from an angle between the first arm and the second arm at the present transfer position is smaller as the posture of the arm unit at the subsequent transfer position.

17. The conveying system according to claim 16, further comprising:
a conveyance room in which the robot is arranged and that keeps atmosphere of an area in which the robot conveys a workpiece clean, wherein
the conveyance room is provided with a load port arranged at the first transfer position and a plurality of load ports arranged at the second transfer position in a manner parallel to a planar wall.

18. The conveying system according to claim 15, further comprising:
a conveyance room in which the robot is arranged and that keeps atmosphere of an area in which the robot conveys a workpiece clean, wherein the conveyance room is provided with a load port arranged at the first transfer position and a plurality of load ports arranged at the second transfer position in a manner parallel to a planar wall.

19. The conveying system according to claim 2, further comprising:
a conveyance room in which the robot is arranged and that keeps atmosphere of an area in which the robot conveys a workpiece clean, wherein
the conveyance room is provided with a load port arranged at the first transfer position and a plurality of load ports arranged at the second transfer position in a manner parallel to a planar wall.

20. The conveying system according to claim 1, wherein, when the controller determines that the plurality of standby postures exist, the controller is configured to generate the trajectory from the current posture of the robot to the selected standby posture with the cylindrical coordinate system to rotate the hand to reach one of the plurality of standby postures after switching to the cylindrical coordinate system.

21. The conveying system according to claim 1, wherein the controller is further configured to perform posture selection to select one of the plurality of standby postures when the plurality of standby postures are symmetric to each other.

22. A conveying system comprising:
a robot that includes an arm unit formed of a hand and a plurality of arms connected rotatably with respect to one another, and a base unit, a first arm of the plurality of arms being connected on a rear end side thereof to the base unit rotatably about a rotation axis and the hand being rotatably connected to a second arm of the plurality of arms on a front end side of the second arm; and
control means for controlling a motion of the robot, the control means being configured to:
determine whether a plurality of standby postures exist,
perform posture selection to select one of the plurality of standby postures,
generate a trajectory from a current posture of the robot to the selected standby posture utilizing a first coordinate system,
switch, by a switching unit, from the first coordinate system to a second coordinate system,
generate a trajectory from the standby posture to the target posture utilizing the second coordinate system,
wherein the first coordinate system is one of a rectangular coordinate system and a cylindrical coordinate system, and the second coordinate system is the other of the rectangular coordinate system and the cylindrical coordinate system.

\* \* \* \* \*